United States Patent
Nagarajan et al.

(10) Patent No.: US 9,591,785 B1
(45) Date of Patent: Mar. 7, 2017

(54) APPARATUS, SYSTEM, AND METHOD FOR INCREASING ACCESS TO TRANSCEIVERS

(71) Applicant: Juniper Networks, Inc., Sunnyvale, CA (US)

(72) Inventors: Mahesh Nagarajan, Campbell, CA (US); Venkata S. Raju Penmetsa, Sunnyvale, CA (US); Rebecca Biswas, San Jose, CA (US); Jack W. Kohn, Mountain View, CA (US); Shreeram Siddhaye, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 234 days.

(21) Appl. No.: 14/228,217

(22) Filed: Mar. 27, 2014

(51) Int. Cl.
| | |
|---|---|
| H05K 7/00 | (2006.01) |
| H05K 7/20 | (2006.01) |
| H05K 5/00 | (2006.01) |
| H01R 13/62 | (2006.01) |
| H05K 5/06 | (2006.01) |
| H04L 12/933 | (2013.01) |

(52) U.S. Cl.
CPC .............. *H05K 7/20* (2013.01); *H01R 13/62* (2013.01); *H05K 5/00* (2013.01); *H05K 5/06* (2013.01); *H04L 49/101* (2013.01)

(58) Field of Classification Search
None
See application file for complete search history.

(56) References Cited

U.S. PATENT DOCUMENTS

| | | | | |
|---|---|---|---|---|
| 6,439,918 | B1* | 8/2002 | Togami | G02B 6/4246 |
| | | | | 439/157 |
| 8,405,985 | B1* | 3/2013 | Reynov | H05K 7/20736 |
| | | | | 361/688 |
| 2004/0197055 | A1* | 10/2004 | Fischer | G02B 6/3869 |
| | | | | 385/92 |
| 2005/0157474 | A1* | 7/2005 | Larson | H01R 13/6335 |
| | | | | 361/728 |
| 2008/0232758 | A1* | 9/2008 | Miyoshi | G02B 6/4201 |
| | | | | 385/136 |
| 2009/0176401 | A1* | 7/2009 | Gu | G02B 6/4201 |
| | | | | 439/372 |
| 2013/0217256 | A1* | 8/2013 | Dudemaine | H01R 13/46 |
| | | | | 439/352 |

OTHER PUBLICATIONS

"Installing and Removing SFP and SFP+ Transceiver Modules", http://h10025.www1.hp.com/ewfrfwc/document?docname=c03421066&cc=us&dlc=en&lc=en, as accessed Feb. 10, 2014, HP Consumer Support, Hewlett-Packard Development Company, L.P., (2014).

(Continued)

*Primary Examiner* — Courtney Smith
*Assistant Examiner* — Zhengfu Feng
(74) *Attorney, Agent, or Firm* — FisherBroyles, LLP

(57) ABSTRACT

The disclosed apparatus may include (1) an access surface that provides access to ports used to connect devices to a telecommunications network via the line card, (2) a back opposite the access surface, (3) a row of ports arranged along the access surface to house a set of transceivers, and (4) a recessed row of ports arranged along the access surface to house an additional set of transceivers, such that the recessed row of ports is recessed inward toward the back relative to the row of ports. Various other apparatuses, systems, and methods are also disclosed.

20 Claims, 7 Drawing Sheets

(56) References Cited

OTHER PUBLICATIONS

"Small form-factor pluggable transceiver", http://en.wikipedia.org/wiki/Small_form-factor_pluggable_transceiver, as accessed Feb. 10, 2014, Wikipedia, (Jul. 23, 2009).
"Faceplate", http://en.wikipedia.org/wiki/Faceplate, as accessed Feb. 10, 2014, Wikipedia, (Aug. 5, 2011).
"Line card", http://en.wikipedia.org/wiki/Line_card, as accessed Feb. 10, 2014, Wikipedia, (Jan. 24, 2005).

* cited by examiner

APPARATUS, SYSTEM, AND METHOD FOR INCREASING ACCESS TO TRANSCEIVERS

BACKGROUND

Individuals and organizations are seeking faster methods for accessing data through networks such as the Internet. Conventional speeds of 10 Mbps and 100 Mbps are no longer adequate for some purposes. Accordingly, these organizations are seeking higher bandwidth connections, such as fiber optic connections, with speeds up to 10 Gbps, for example.

To achieve these faster speeds through fiber optic connections, individuals and organizations may subscribe to a telecommunications network. Each subscription may correspond to a subscriber fiber optic line. Eventually, a number of subscriber fiber optic lines and associated networking components may meet at a large chassis (e.g., a router may connect the various lines to the larger telecommunications network).

In some examples, the large chassis may be structured to house modular line cards that receive the various subscriber fiber optic lines. Specifically, the line cards may contain numerous ports that receive the subscriber fiber optic lines. The modular nature of the line cards may allow the line cards to be easily inserted, rearranged, and/or removed from the chassis.

The numerous ports on a line card may be arranged in one or more rows. Nevertheless, as discussed in the detailed description below, the desire for maximum ports within a fixed chassis size may result in a compressed area for accessing the ports. For example, fiber optic connections may connect to latched line card ports. The compressed area for the rows of ports may inhibit access to the ports and/or the corresponding latches. The instant disclosure, therefore, identifies and addresses a need for increasing access to transceivers.

SUMMARY

As will be described in greater detail below, the instant disclosure generally relates to apparatuses, systems, and methods for increasing access to transceivers. In one example, an apparatus (such as a line card) for accomplishing such a task may include an access surface that provides access to ports used to connect devices to a telecommunications network via the line card. The apparatus may also include a back opposite the access surface. Moreover, the apparatus may further include a row of ports arranged along the access surface to house a set of transceivers. Similarly, the apparatus may also include a recessed row of ports arranged along the access surface to house an additional set of transceivers. The recessed row of ports may be recessed inward toward the back relative to the row of ports.

Similarly, a system incorporating the above-described apparatus may include a telecommunications chassis that includes (A) slots for housing modular line cards and (B) connectors arranged to connect each of the module line cards to a telecommunications network. Moreover, the system may also include modular line cards connected to the telecommunications network through the connectors. One of the modular line cards may include an access surface that provides access to ports used to connect devices to the telecommunications network via the line card. The line card may also include a back opposite the access surface. Moreover, the line card may further include a row of ports arranged along the access surface to house a set of transceivers. Similarly, the line card may further include a recessed row of ports arranged along the access surface to house an additional set of transceivers such that the recessed row of ports is recessed inward toward the back relative to the row of ports.

A corresponding method may include providing a line card that includes an access surface that provides access to ports used to connect devices to a telecommunications network via the line card. The line card may also include a back opposite the access surface. Moreover, the method may further include arranging a row of ports along the access surface to house a set of transceivers. Similarly, the method may also include arranging an additional row of ports along the access surface to house an additional set of transceivers. Lastly, the method may include recessing the additional row of ports inward toward the back relative to the row of ports.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
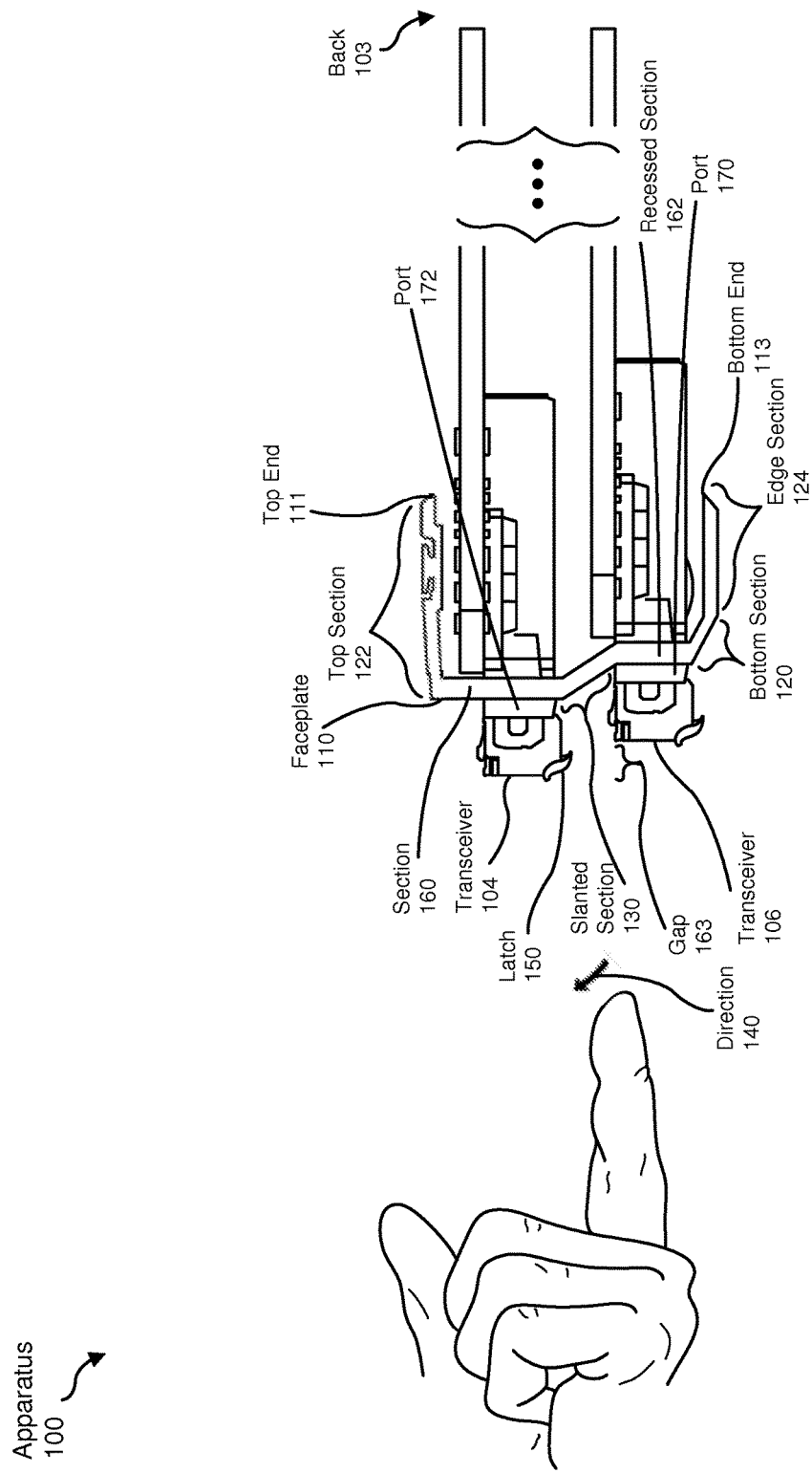
FIG. 1 is a block diagram of an exemplary line card with increased access to transceivers.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for increasing access to transceivers. As will be explained in greater detail below, embodiments of the instant disclosure may increase access to ports and corresponding transceivers (and transceiver latches) on line cards for telecommunications networks. Specifically, the disclosed apparatuses, systems, and methods may increase a surface area of a line card access surface (and corresponding faceplate). Moreover, the disclosed apparatuses, systems, and methods may similarly increase a distance (e.g., horizontal or slanted distance) between two rows of ports, while minimizing a vertical expansion between rows of ports and otherwise maintaining a high density of ports on the access surface, as discussed below.

The following will provide, with reference to FIGS. 1-5, examples of lines cards with increased access to transceivers. Additionally, the discussion corresponding to FIG. 6 will provide a detailed description of an exemplary method for increasing access to transceivers. Finally, the discussion corresponding to FIG. 7 will provide numerous examples of systems that may include the components and circuits shown in FIGS. 1-5.

FIGS. 1-5 show block diagrams of an exemplary apparatus 100, such as a line card, and a corresponding chassis (in FIG. 3), for increasing access to transceivers. The term "line card," as used herein, generally refers to circuit boards with one or more ports (e.g., on one side, the "front") for receiving subscriber, client, and/or network lines, such that the circuit boards connect (or help connect) those lines to another network (e.g., through one or more ports on another side of the line card, such as the "back," which may also include a port for power). To be clear, the term "client" may simply refer to devices served by the larger telecommunications network, including devices that also constitute servers and provide services for other clients. Line cards may be modular such that they are easily inserted, rearranged, and/or removed from a larger chassis. The chassis, with corresponding network components, may connect to each line card through the other (e.g., "back") ports, thereby connecting the subscriber lines to the other network (e.g., as a router).

As shown in FIG. 1, apparatus 100 may include an access surface that provides access to ports, such as a port 170 and a port 172, used to connect devices to the telecommunications network via apparatus 100 (e.g., a line card). As used herein, the term "access surface" refers to the general contact surface on the front of an apparatus (e.g. apparatus 100 as shown in FIG. 1). An access surface may be formed by the front and corresponding components of an apparatus, such as transceivers, ports, and/or a faceplate 110. In other words, the access surface may include a surface of the apparatus to which a user or administrator connects subscriber or network lines. Moreover, the term "face" or "front," as used herein, generally refers to a side of a device that has ports for receiving subscriber or client-side lines to connect those lines to the telecommunications network. In some examples, the term "face" or "front" may refer to a side closest to an individual after the individual inserts apparatus 100 within a chassis, as discussed further below.

Furthermore, as used herein, the term "telecommunications network" broadly refers to any type or form of network for communicating information, including telephone, cellular, and/or computer networks, such as the Internet. Similarly, the term "port," as used herein, generally refers to any slot or connector for receiving network lines and/or connecting the same to apparatus 100, as discussed further below.

As further shown in FIG. 1, apparatus 100 may also include a back 103 opposite the access surface that includes port 170 and port 172. Due to size constraints, FIG. 1 uses an ellipses to omit a middle of apparatus 100 (e.g., a middle of a circuit board of apparatus 100), thereby making room to illustrate back 103 at the end of apparatus 100 opposite the access surface.

Apparatus 100 may also include a row of ports, including port 172, arranged along the access surface to house a set of transceivers, including a transceiver 104. As used herein, the term "transceiver" generally refers to any type or form of device or network component (e.g., a physical, hot-pluggable component) that both receives information from, and transmits information to, the telecommunications network. In fiber optic systems, transceivers may include both a transmitter to transmit light (e.g., a laser) and a detector to detect the light across a fiber optic channel.

In some examples, any one or more of the transceivers on apparatus 100 may include a small form-factor ("SFP") pluggable transceiver. SPF transceivers may support SONET, GIGABIT ETHERNET, FIBRE CHANNEL, and/or other communications standards. SFP transceivers may similarly belong to one or more categories, including SX, LX, EX, ZX, EZX, BX, SFSW, CWDM, DWDM, 100BASE-t, and/or SFP+. SFP transceivers may plug into SFP sockets, including ports on the access surface of apparatus 100. These sockets may be included in Ethernet devices (e.g., switches and line cards), network interface cards, and/or storage interface cards (e.g., HOST BUS ADAPTERS or FIBRE CHANNEL storage switches). In general, the transceivers may couple network device motherboards (e.g., subscriber device motherboards) to a fiber optic, copper, and/or other network.

As further shown in FIG. 1, apparatus 100 may also contain a recessed row of ports, including a port 170, arranged along the access surface to house an additional set of transceivers, including a transceiver 106. Because FIG. 1 shows a profile of apparatus 100, FIG. 1 does not illustrate each distinct port and transceiver in the rows of ports and corresponding transceivers. Rather, a remainder of each row of ports and corresponding transceivers may be located behind port 172, transceiver 104, port 170, and transceiver 106, as further illustrated in later figures.

The recessed row of ports, including port 170, may be recessed inward toward back 103 relative to the row of ports that includes port 172. In other words, the rows of ports may be arranged on the access surface to create a horizontal gap 163 such that the row of ports that includes port 170 is closer to back 103 than the row of ports that includes port 172. In some examples, gap 163 may be smaller than a horizontal length from an opening of a port, such as port 172, to an access end of a transceiver, such as transceiver 104. In other examples, gap 163 may be the same, substantially the same, greater than, or substantially equivalent to a multiple (2, 3, 4, or 5 times, for example) of that horizontal length.

Notably, the rows of ports might also be arranged on the access surface to create, or increase, a vertical gap between them. Nevertheless, design specifications and/or market demands might limit the amount of vertical tolerance in which to create a vertical gap while maintaining a high density (e.g., a high vertical density) of rows of ports on the access surface of apparatus 100. Accordingly, the disclosed apparatuses, system, and methods may increase access to transceivers (e.g., transceiver 104) by creating gap 163. A user of apparatus 100 may thereby avoid transceiver 106 from blocking or obstructing access to transceiver 104, because transceiver 106 is recessed further inward than transceiver 104, enabling a finger (for example) to reach within gap 163 to touch, manipulate, and/or unlatch transceiver 104, as discussed further below.

Notably, the terms "horizontal" and "vertical," and similar terms, such as "top" and "bottom," are relative references for the illustrative embodiments of FIG. 1 and corresponding figures. Apparatus 100 may be oriented in any other direction, and the telecommunications chassis might be structured to receive line cards on a top side and/or any of various lateral sides, for example. Moreover, the telecommunications chassis might be structured to receive line cards at any orientation, including straight horizontal (as in FIG. 1), straight vertical (where the line cards are oriented perpendicular to that orientation in FIG. 1), and slanted. For these reasons, the terms "horizontal" and "vertical," and similar terms, such as "top" and "bottom" broadly encompass any line card configuration that provides the benefit of increasing access to one row of transceivers by creating a gap between the row and another row in a manner that recesses the other row toward a back of the line card.

For similar reasons, although the bottom transceiver, transceiver 106, is recessed in FIG. 1, while the other transceiver, transceiver 104 is not, this application also contemplates the reverse situation, in which transceiver 106 is not recessed, and transceiver 104 is recessed, thereby providing the same benefit. Also for similar reasons, the term "row," as used herein, includes any substantially straight line such that the row of ports, and the recessed row of ports, are substantially parallel. Moreover, in an alternative embodiment, apparatus 100 may simply include a single port 172 and transceiver 104, and a single recessed port 170 and transceiver 106, instead of including rows of multiple ports and multiple transceivers.

Furthermore, in some examples, port 170 and port 172 (and their transceivers) may correspond to the same type of ports (or network connections), such as the SFP sockets discussed above, as opposed to one port corresponding to one type of network connection and the other (recessed) port corresponding to another type of network connection. In other words, in these examples, apparatus 100 may create a gap 163 that creates a distance between rows of ports and/or transceivers of the same type, which might otherwise be oriented flush at the same offset.

As further shown in FIG. 1, apparatus 100 may include faceplate 110. The term "faceplate," as used herein generally refers to a solid, firm, or semi-solid plate, cover, or bezel on the face (i.e., front) of apparatus 100. In general, faceplate 110 may provide a structure through which network lines and/or corresponding transceivers, such as transceiver 104 and transceiver 106, may connect to the underlying circuit board(s) within apparatus 100. Faceplate 110 may thereby provide a face or access surface for apparatus 100.

As also shown in FIG. 1, in one example, faceplate 110 may also include a section 160 that fits the row of ports that includes port 172. Moreover, faceplate 110 may also include a recessed section 162 that fits the recessed row of ports that includes port 170. As shown in FIG. 1, recessed section 162 may be generally recessed toward back 103 relative to section 160. In some examples, the entirety of recessed section 162 may be recessed toward back 103 without overlapping (in a vertical direction of FIG. 1) with section 160.

In some examples, faceplate 110 may be formed as a single continuous member of apparatus 100. In other words, faceplate 110 may be formed as a continuous piece of metal, plastic, and/or other rigid or semi-rigid material, as opposed to forming a mechanically coupled aggregation of distinct parts (e.g., plastic or metal arms or bars).

In further examples, faceplate 110 may also include a slanted section 130, between section 160 and recessed section 162, that slants toward back 103 opposite the access surface. In some examples, slanted section 130 may directly connect section 160 and recessed section 162, without another row of ports being located between them. In other examples, slanted section 130 may indirectly connect section 160 and recessed section 162 (e.g., with one or more rows of ports between them). As shown in FIG. 1, slanted section 130 is generally non-coplanar with section 160 and recessed section 162. Moreover, in some examples, section 160 and recessed section 162 may be generally or substantially oriented at the same angle, which may substantially diverge from an angle formed by slanted section 130, as shown in FIG. 1. In specific examples, such as that shown in FIG. 1, section 160 and recessed section 162 may be substantially vertical and perpendicular to a plane formed by a circuit board of apparatus 100. In the same or further examples, slanted section 130 may be substantially neither perpendicular nor parallel to a plane formed by the circuit board (e.g., slanted section 130 may be skewed, as shown in FIG. 1).

Moreover, as shown in FIG. 1, an acute angle formed by slanted section 130 and the plane of the circuit board may be smaller (e.g., substantially smaller) than an angle formed by section 160 and/or recessed section 162 with the circuit board. In other words, slanted section 130 may be slanted toward back 103 more sharply than section 160 and/or recessed section 162 (which may both be substantially parallel). Moreover, section 160 and/or recessed section 162 may also be slanted toward back 103, but not as sharply as slanted section 130.

As further shown in FIG. 1, section 160, recessed section 162, and slanted section 130 (and any other sections of faceplate 110) may be connected by pointed bends. In other examples, however, these sections may be connected by non-pointed, smooth, continuous, and/or curving bends. In further examples, faceplate 110 may curve more sharply near a knee or bend between any two adjacent sections, while curving less sharply along a section between two bends.

In some examples, as shown in FIG. 1, slanted section 130 may be located adjacent to section 160 (e.g., without another row of ports between them). In general, a primary but not exclusive benefit of section 160, and/or corresponding gap 163, may be to improve access to the adjacent (non-recessed) row of ports, including port 172, and their corresponding transceivers, such as transceiver 104.

Figure 2:
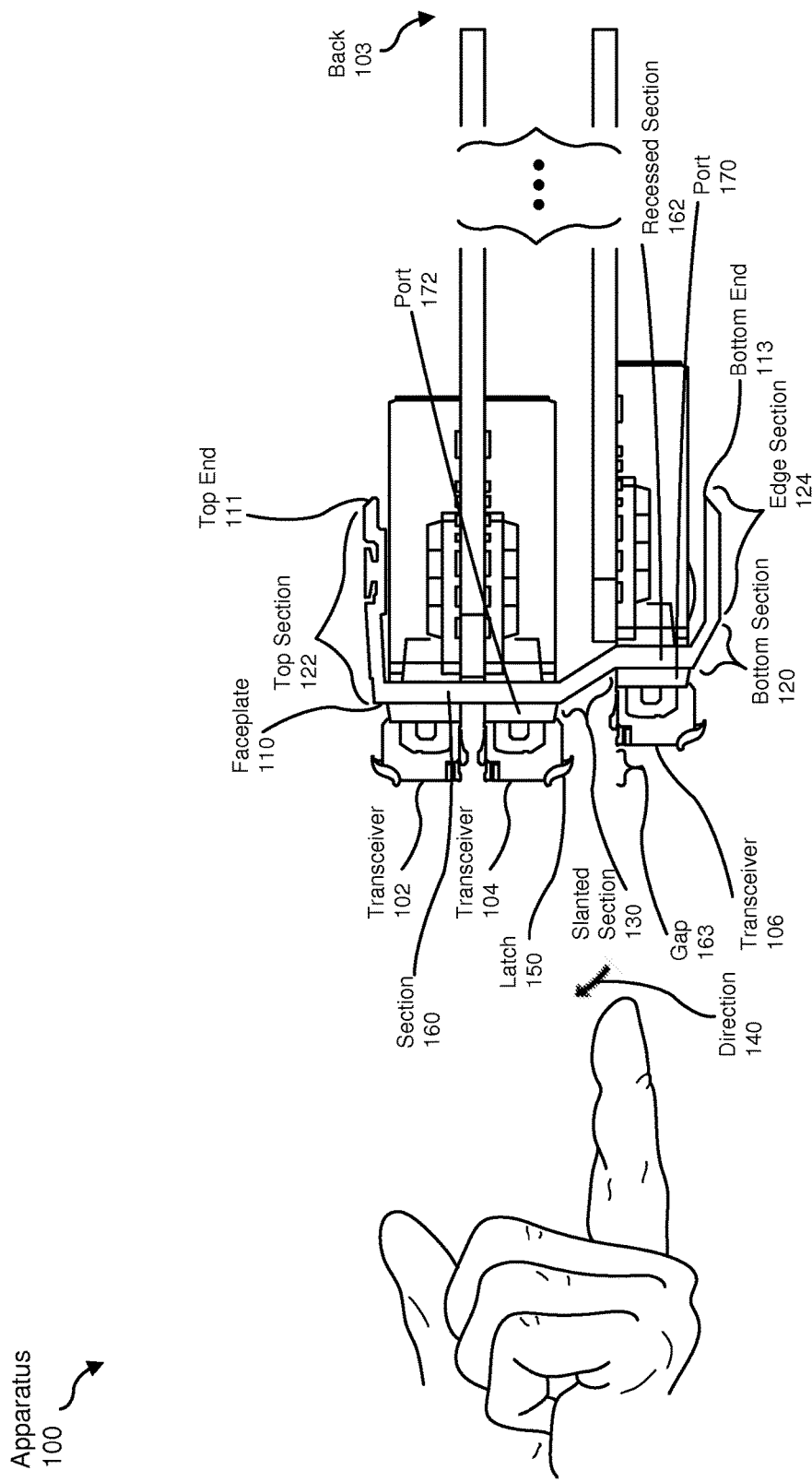
FIG. 2 is a block diagram of an exemplary line card with increased access to transceivers.

FIG. 2 shows another example of apparatus 100, which may include an additional row of ports corresponding to a further set of transceivers, including a transceiver 102. FIG. 2 illustrates how apparatus 100 may include any number of rows of ports, any two of which might be substantially parallel and benefit from recessing one of them and/or creating a gap such as gap 163. FIG. 2 shows three layers of ports and corresponding transceivers, with a single gap 163, but apparatus 100 might include any arbitrary number of rows of ports and transceivers and any number of corresponding gaps.

In some examples, an additional row of ports may be recessed even further than the row of ports that includes port 170. For example, although not shown in FIG. 2, in another example, apparatus 100 may include an additional row of ports below the recessed row of ports that includes port 170. The additional row of ports may be recessed even farther than the recessed row of ports. In other words, further recessing the additional row of ports may create an additional gap between the recessed row of ports (including port 170) and the further recessed, additional row of ports. In some examples, the additional gap may begin at a horizontal distance where gap 163 ends, thereby further recessing the additional row of ports toward back 103. Moreover, in some examples, gap 163 and the additional gap may be substantially the same size. In general, apparatus 100 may include any arbitrary number of gaps created by recessing rows of ports and/or through one or more slanted sections of faceplate 110. In some examples, one gap may begin at a distance, with respect to a direction toward back 103 (e.g., horizontal in FIG. 2) where another gap ends, thereby stacking gaps upon each other in a direction toward back 103.

In general, for any row of ports on apparatus 100, an adjacent row of ports may be (A) arranged at the same distance (e.g., substantially coplanar, corresponding to transceiver 102 and transceiver 104) toward back 103 as the row of ports, (B) recessed further toward back 103 than the row of ports (e.g., transceiver 106 is recessed toward back 103 relative to transceiver 104), or protruded away from back 103 relative to the row of ports (e.g., transceiver 104 is protruded away from back 103 relative to transceiver 106). Moreover, beginning at any row of ports and proceeding in one direction (e.g., up or down in FIG. 2) away from the row of ports, subsequent rows of ports may follow the patterns of (A), (B), and/or (C) in any arbitrary and/or random sequence. The rows of ports may thereby create (symmetrical or asymmetrical) valleys of arbitrary deepness toward back 103 and/or (symmetrical or asymmetrical) hills of arbitrary height away from back 103. As one random example, beginning with a top row of ports and transceivers, and moving downward, subsequent rows of ports and transceivers may: maintain the same distance as the last row, be recessed relative to the last row, be further recessed relative to the last row, maintain the same distance as the last row, protrude away from back 103 relative to the last row, etc.

Nevertheless, in some examples, design specifications and market demands may constrict the horizontal tolerance within which designers may recess and/or protrude rows of ports. Accordingly, apparatus 100 may include multiple recessed rows of ports that are all recessed the same distance, or substantially the same distance, toward back 103. For example, for each slanted section, such as slanted section 130, that slants toward back 103, apparatus 100 may include a corresponding other slanted section that slants in the opposite direction. The other slanted section may thereby return a subsequent row of ports to an original distance from back 103. Apparatus 100 may include any number of pairs of slanted sections and corresponding reversed slanted sections, as discussed above, thereby ensuring that multiple recessed rows of ports are all recessed at substantially the same distance and/or do not violate a tolerance for horizontal distance in either direction (e.g., left or right in FIGS. 1 and 2).

As discussed above, the various gaps formed by these layers of recession and/or protrusion may substantially overlap and/or fail to overlap (e.g., one may begin at a distance toward back 103 where another ended). Similarly, the various gaps may all be the same size, substantially the same size, and/or different sizes. As a practical matter, the nature of a line card (e.g., as a modular "card" corresponding to a circuit board) encourages designers to make them relatively thin, such that the number of rows of ports tends to remain relatively low. Nevertheless, this application contemplates and encompasses embodiments with arbitrary numbers of rows of ports, as discussed above.

As further shown in FIGS. 1 and 2, the set of transceivers that includes transceiver 104 may include latches, such as latch 150, for accessing the row of ports that includes port 172. Latch 150 may include a MYLAR tab latch, an actuator button latch, a bail clasp latch, and/or any other suitable latch. As with a bail clasp latch, and as shown in FIGS. 1 and 2, latch 150 may include a grip on one end (e.g., top or bottom in FIGS. 1 and 2) that an individual (e.g., with a finger) may manipulates or pulls open (e.g., across a surface of transceiver 104). Latches may be used with SFP and SFP+ transceivers, for example.

FIGS. 1 and 2 further illustrate how the latches are arranged to open in a direction 140 that is substantially opposite a direction from the row of ports (including port 172) to the recessed row of ports (including port 170). In other words, recessing the recessed row of ports that includes port 170 increases access, not just to transceiver 104, but more specifically to the bottom edge of transceiver 104 (e.g., the edge adjacent gap 163) where movement to open latch 150 begins, as shown in FIGS. 1 and 2. Thus, in various embodiments, the disclosed apparatuses, systems, and methods may arrange or orient transceivers adjacent a gap (e.g., created by a slanted portion of faceplate 110) such that latches of those transceivers are configured to open in a direction away from the corresponding gap. For example, if one row of transceivers lies above a gap, as in FIGS. 1 and 2, then the transceivers may be oriented such that latches on those transceivers open away from the gap in a substantially up direction. Conversely, if one row of transceivers lies below a gap, then the transceivers may be oriented such that latches on those transceivers open away from the gap in a substantially down direction.

More generally, the disclosed apparatuses, systems, and methods may orient transceivers such that whatever item a finger needs to touch or manipulate (e.g., a button, a string, a fastener, etc.) to open a latch is located near the gap as opposed to the other side of the transceiver. Thus, in exemplary embodiments, whenever two rows are located adjacent each other (e.g., without another row and/or slanted section of faceplate 110 between them), their latches may be oriented at the outermost edges of the pair of rows, as illustrated with transceiver 102 and transceiver 104 in FIG. 2, which open toward each other (rather than away from each other). Similarly, for some or all of these pairs of adjacent rows, gaps, such as gap 163 (and the larger gap formed above transceiver 102 in FIG. 2) may be placed on the outer sides of the pair of rows (e.g., as with transceiver 102 and transceiver 104 in FIG. 2), thereby increasing access to the latches formed at the outer edges of the respective transceivers. These specific embodiments may thereby maximize the direct benefits of recessing the row of ports and transceivers toward back 103.

For the same reasons, latches at a top and/or bottom of apparatus 100 may be oriented such that the latches open toward a vertical center of apparatus 100 (e.g., top latches open toward the bottom, and vice versa), as shown in FIG. 1. Similarly, one or both rows of ports at a (outermost) top and/or bottom of apparatus 100 may be non-recessed, such as the row of ports corresponding to transceiver 102, because the space above and below these rows naturally creates gaps in which the transceivers may be accessed and manipulated (e.g., without artificially creating a gap through a slanted section of faceplate 110).

Figure 3:
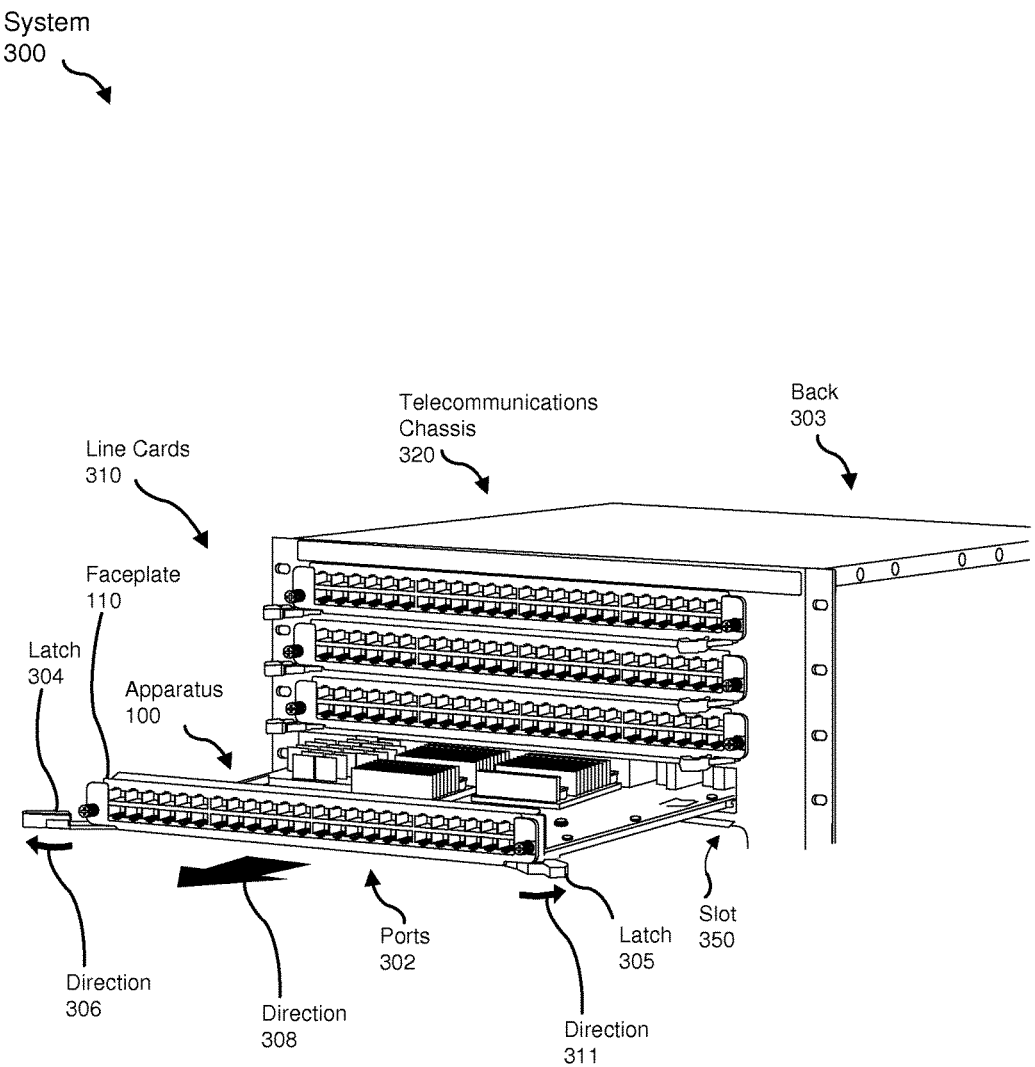
FIG. 3 is a block diagram of an exemplary system including a chassis which may house line cards with increased access to transceivers.

FIG. 3 shows an exemplary system 300 that includes line cards having increased access to transceivers. In one example, system 300 may include a telecommunications chassis 320, which may further include slots, such as slot 350, for housing modular line cards 310, such as apparatus 100 (which may be inserted into slot 350). Telecommunications chassis 320 may further include connectors arranged to connect each of modular line cards 310 to a telecommunications network. Although these connectors are not shown in the front view of FIG. 3, in some examples the connectors may generally be located near a back 303 of telecommunications chassis 320.

As further shown in FIG. 3, system 300 may also include modular line cards 310 connected to the telecommunications network through the connectors. One of the modular line cards may correspond to apparatus 100 introduced in FIGS. 1 and 2, and further shown in FIG. 3. As discussed above, apparatus 100 may include an access surface that provides access to ports 302 used to connect devices to the telecommunications network via apparatus 100. Apparatus 100 may further include a back 103 opposite the access surface, as shown in FIGS. 1 and 2. Moreover, apparatus 100 in FIG. 3 may include a row of ports arranged along the access surface to house a set of transceivers. Similarly, apparatus 100 in FIG. 3 may further include a recessed row of ports arranged along the access surface to house an additional set of transceivers. As discussed above, the recessed row of ports may be recessed inward toward back 103 relative to the row of ports.

FIG. 3 also shows how apparatus 100 may further include a latch 304 and a latch 305. Notably, these latches may be distinct from latch 150, discussed above. As shown in FIG. 3, a user may manipulate latch 304 and latch 305, in a direction 306 and a direction 311, respectively, to effectively unlock or release apparatus 100 as a modular line card. The user may then retrieve apparatus 100 by gently pulling apparatus 100 in a direction 308. Conversely, the user may insert apparatus 100 by gently pushing apparatus 100 in the opposite of direction 308, into slot 350, and then lock latch 304 and latch 305 (in the opposite of direction 306 and direction 311, respectively).

Figure 4:
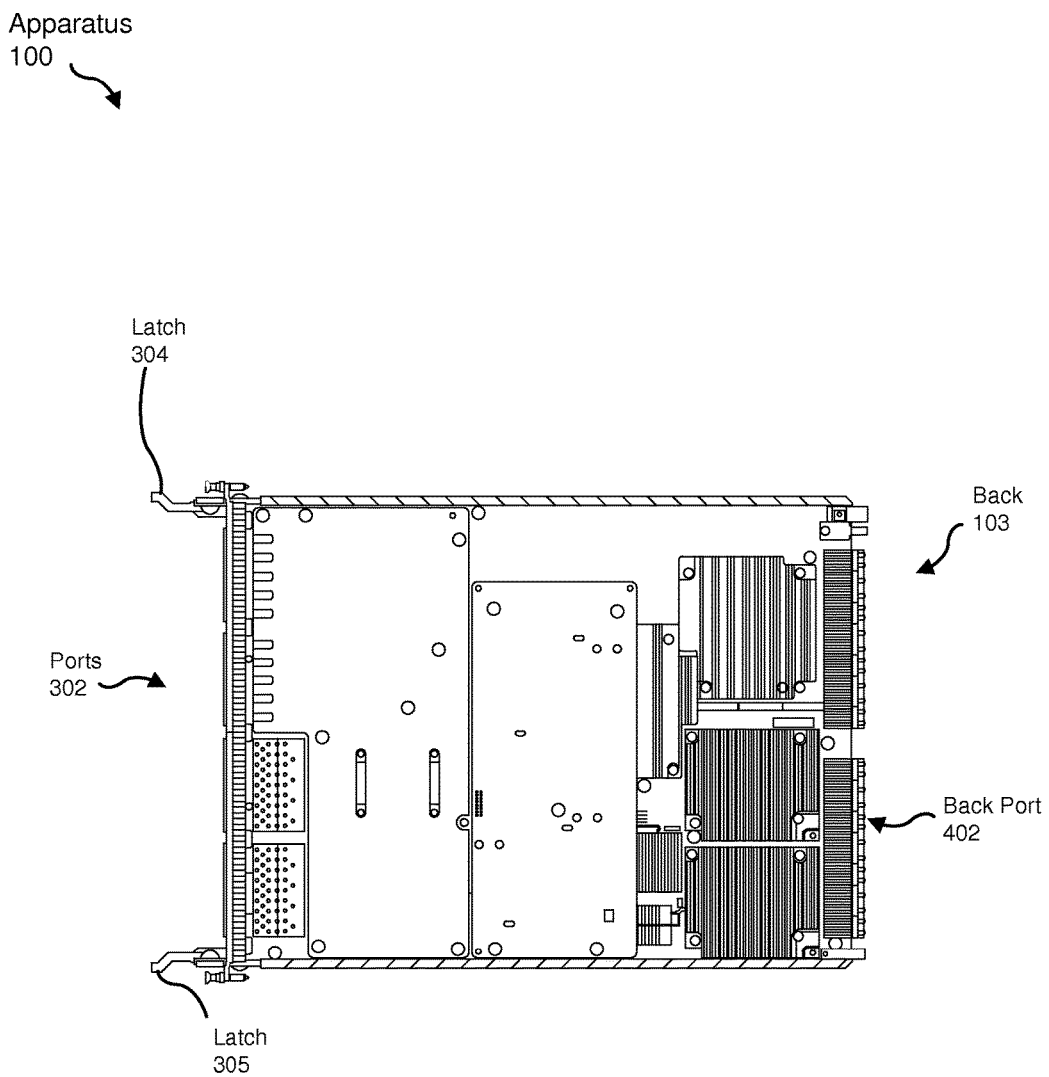
FIG. 4 is a block diagram, from a top perspective, of a line card with increased access to transceivers.

FIG. 4 shows another view (a top view) of exemplary apparatus 100. FIG. 4 further illustrates the orientation between latch 304, latch 305, and ports 302 (shown in FIG. 3) with respect to back 103 and back ports, such as a back port 402 (not shown in the front view of system 300 in FIG. 3). The back ports may connect to the connectors of telecommunications chassis 320, as discussed above. With reference to FIGS. 1 and 2, FIG. 4 also provides a clearer view of back 103 toward which the recessed row of ports, including port 170, is recessed (i.e., recessed in a direction from ports 302 toward back 103).

Returning to FIG. 1, in some examples, faceplate 110 may further include a slanted top section 122, adjacent a top end 111 of faceplate 110, that slants toward back 103 opposite the access surface of apparatus 100. Moreover, faceplate 110 may similarly include a slanted bottom section 120, adjacent a bottom end 113 of faceplate 110, that slants toward back 103 opposite the access surface of apparatus 100.

As used herein, the terms "top end" and "bottom end" generally refer to an uppermost and a bottommost point of the line formed by faceplate 110, as seen from the perspective of FIG. 1. Similarly, as used herein, the terms "slanted top section" and "slanted bottom section" generally refer to slanted sections of faceplate 110 that are not surrounded (in the profile perspective of FIG. 1) by rows of ports and corresponding transceivers. In other words, the terms "slanted top section" and "slanted bottom section" generally refer to sections of faceplate 110 that are near top end 111 and bottom end 113 (respectively) and that, in combination, effectively surround ports 302.

As shown in FIG. 1, top section 122 and bottom section 120 may generally be skewed and/or non-perpendicular to a plane formed by a circuit board of apparatus 100. Moreover, top section 122 and bottom section 120 may generally be slanted in a manner parallel to, or the same as, slanted section 130 (e.g., slanted at a sharper angle than section 160 and recessed section 162). In the example of FIG. 1, top section 122 may include the entirety of faceplate 110 between section 160 and top end 111. In contrast, bottom section 120 may only include a portion of faceplate 110 between recessed section 162 and bottom end 113. Specifically, a perpendicular edge section 124 may be interposed between bottom section 120 and bottom end 113.

FIG. 1 merely illustrates an exemplary embodiment. Either or both of bottom section 120 and top section 122 may be separated from bottom end 113 and top end 111, respectively, by none, one, or more other sections, each of which may be slanted or skewed, or instead flat, such as edge section 124. Each of these sections (i.e., on the outer portions of faceplate 110 beyond the centralized ports 302) may be joined by sharp bends, and/or smooth continuous curves, as discussed above regarding the joints between section 160, slanted section 130, and recessed section 162. In some examples, each of subsequent multiple sections of faceplate 110 on the outside of ports 302 may form an increasingly sharp angle with a plane formed by a circuit board of apparatus 100 (where the flatness of edge section 124 illustrates a maximally sharp angle), thereby forming an approximately rounded, but staggered, corner of faceplate 110.

More specifically, top section 122 and bottom section 120 may effectively replace, in other line cards, a sharp, or perpendicular, bend between a vertical face of faceplate 110 and horizontal sections near top end 111 and bottom end 113. Instead of these sharp or perpendicular bends, top section 122 and bottom section 120 may slant at a skewed angle, as shown in FIG. 1. By slanting at these skewed angles, top section 122 and bottom section 120 may effectively increase the surface area of faceplate 110. Importantly, top section 122 and bottom section 120 may effectively increase this surface area while still satisfying constraints on apparatus 100 for vertical space and port density.

Figure 5:
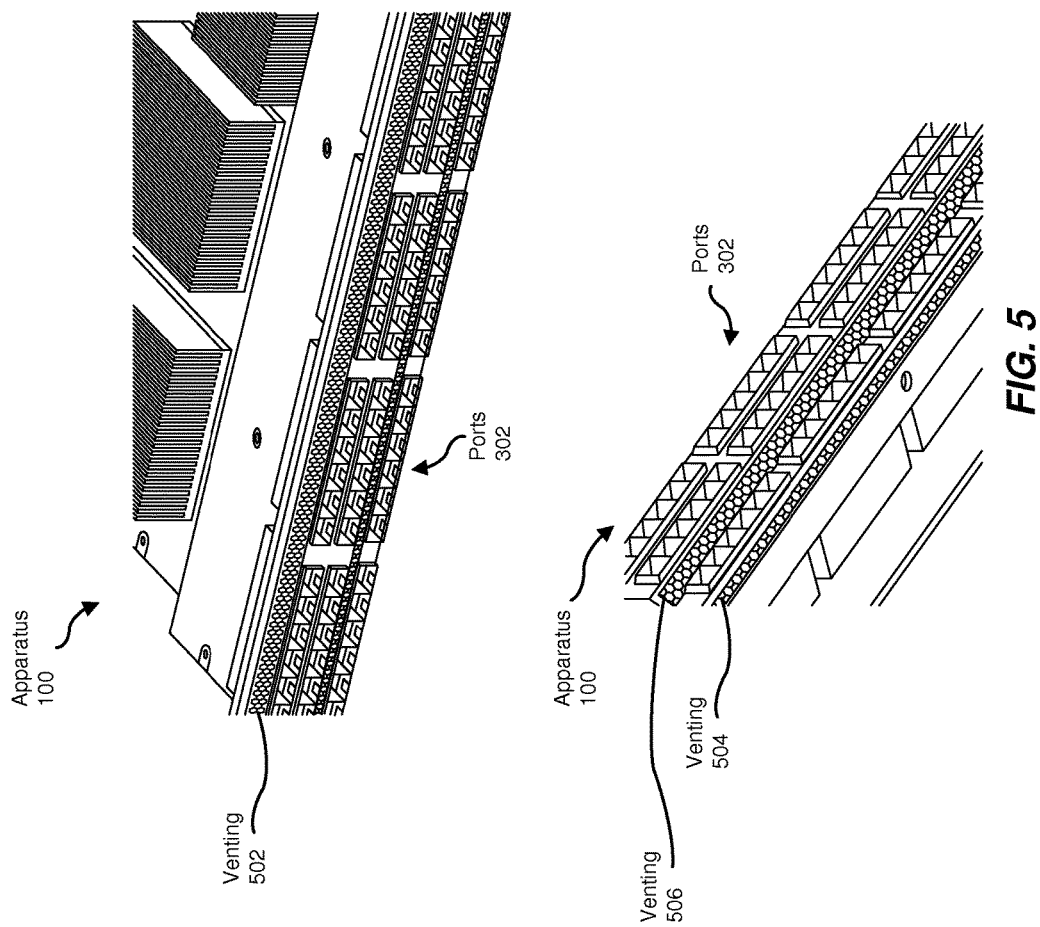
FIG. 5 includes two close up views of a line card with increased access to transceivers and improved venting over an access surface.

Effectively increasing the surface area of faceplate 110 has the advantage of increasing the amount of venting available through faceplate 110. FIG. 5 shows two close up views of apparatus 100 with a focus on ports 302 and corresponding venting. As used herein, the term "venting" generally refers to one or more holes (e.g., through faceplate 110) or membranes that permit the release or transfer of air, which may help cool apparatus 100 in some examples. The top view of FIG. 5 provides a view looking down onto the top of apparatus 100 from an angle. As shown in this top view, venting 502 may allow air to pass through some or all of top section 122, as further shown in FIG. 1.

Similarly, the bottom view of FIG. 5 provides a view looking up onto the bottom of apparatus 100 from an angle. As shown in this bottom view, venting 504 may allow air to pass through some or all of bottom section 120, as further shown in FIG. 1. Moreover, venting 506 may similarly allow air to pass through some or all of slanted section 130, as further shown in FIG. 1. These slanted sections (and any other slanted sections) of faceplate 110 effectively increase the surface area of faceplate 110, thereby creating room for further venting that did not exist previously.

Figure 6:
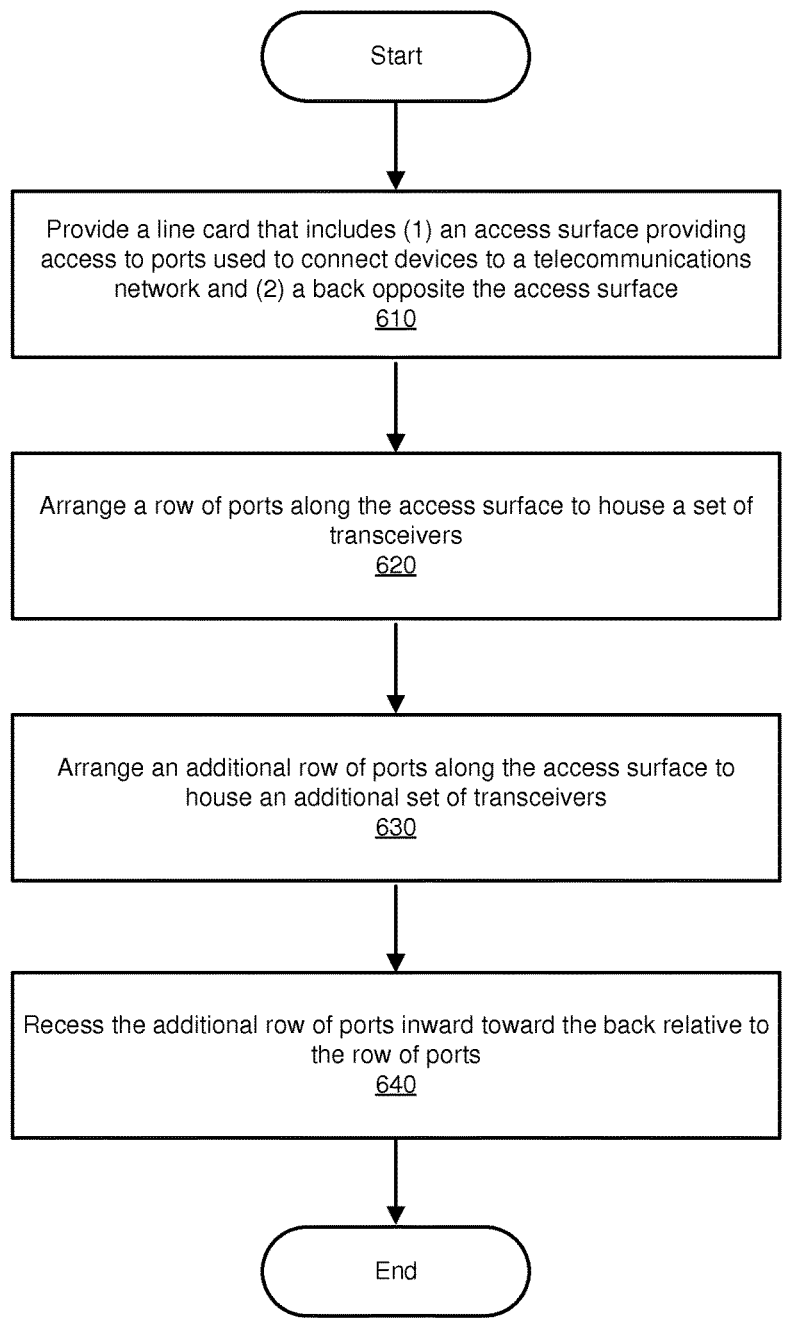
FIG. 6 is a flow diagram of an exemplary method for increasing access to transceivers.

FIG. 6 is a flow diagram of an exemplary method 600 for increasing access to transceivers. Method 600 may include the step of providing a line card, such as a version of apparatus 100 in construction, which includes both (1) an access surface providing access to ports, such as ports 302, used to connect devices to a telecommunications network and (2) a back 103 opposite the access surface (610). This step may be performed in a variety of ways. For example, a manufacturer or other entity may aggregate a circuit board for apparatus 100 with a faceplate for apparatus 100, such as faceplate 110. In other examples, the manufacturer or other entity may aggregate or connect the circuit board for apparatus 100 to ports 302 using any other equivalent structure or means (e.g., without using faceplate 110).

Returning to FIG. 6, method 600 may also include the step of arranging a row of ports along the access surface to house a set of transceivers (620). Similarly, method 600 may also include the step of arranging an additional row of ports along the access surface to house an additional set of transceivers (630). These steps may be performed in a variety of ways. For example, the row of ports may include port 172, and the additional row of ports may include port 170, as discussed above for FIGS. 1 and 2. Similarly, the set of transceivers may include transceiver 104, and the additional set of transceivers may include transceiver 106, as also discussed above for FIGS. 1 and 2. In general, a manufacturer or other entity may arrange these rows of ports and/or corresponding transceivers in any manner parallel to providing apparatus 100 in step 610, such as by aggregating ports 302 with faceplate 110 and/or a circuit board for apparatus 100. Similarly, the manufacturer or other entity may arrange these rows of ports and/or corresponding transceivers in any arrangement or orientation shown in FIGS. 1-3 and 5. In general, the manufacturer or other entity may generally arrange the row of ports (including port 172) and the additional row of ports (including port 170) to be substantially parallel (as shown in FIG. 3) even though the additional row of ports may be recessed toward back 103.

Returning to FIG. 6, method 600 may also include the step of recessing the additional row of ports inward toward back 103 relative to the row of ports (640). This step may be performed in a variety of ways. In general, this step may be performed in any manner that fixedly positions the additional row of ports at the recessed position in apparatus 100, as shown in FIG. 1, for example. In one embodiment, a manufacturer or other entity may recess the additional row of ports (e.g., including port 170) by fitting the additional row of ports into recessed section 162 of faceplate 110.

In other examples, faceplate 110, or another mechanical structure on apparatus 100, may include a switch, cam, and/or slide that enables a user to toggle the additional row of ports into one of multiple positions. In these examples, a wired or other connection between the row of ports and a circuit board of apparatus 100 may include enough slack to allow for movement between the recessed and non-recessed position. For example, the user may toggle or switch the additional row of ports into one position, flush with the other row of ports (including port 172). Similarly, the user may toggle or switch the additional row of ports into a recessed position, as shown in FIG. 1. In these examples, the mechanical switch, which toggles between recessed and non-recessed positions for the same row of ports, may enable a user to enjoy the benefits of recessed ports without incurring any space or convenience costs associated with recessing multiple rows of ports at the same time. In other words, although multiple line cards plugged into telecommunications chassis 320 may have the latent functionality (through the mechanical switch) to achieve a recessed position, only one (or none) of these rows of ports may be recessed at any given time. The mechanical switch embodiment, therefore, may enable users to enjoy the aesthetic and functional benefits of both recessed and non-recessed positions for the same line card.

As explained above, embodiments of the instant disclosure may increase access to ports and corresponding transceivers (and transceiver latches) on line cards for telecommunications networks. Specifically, the disclosed apparatuses, systems, and methods may increase a surface area of a line card access surface (and corresponding faceplate). Moreover, the disclosed apparatuses, systems, and methods may similarly increase a distance (e.g., horizontal or slanted distance) between two rows of ports, while minimizing a vertical expansion between rows of ports and otherwise maintaining a high density of ports on the access surface.

Figure 7:
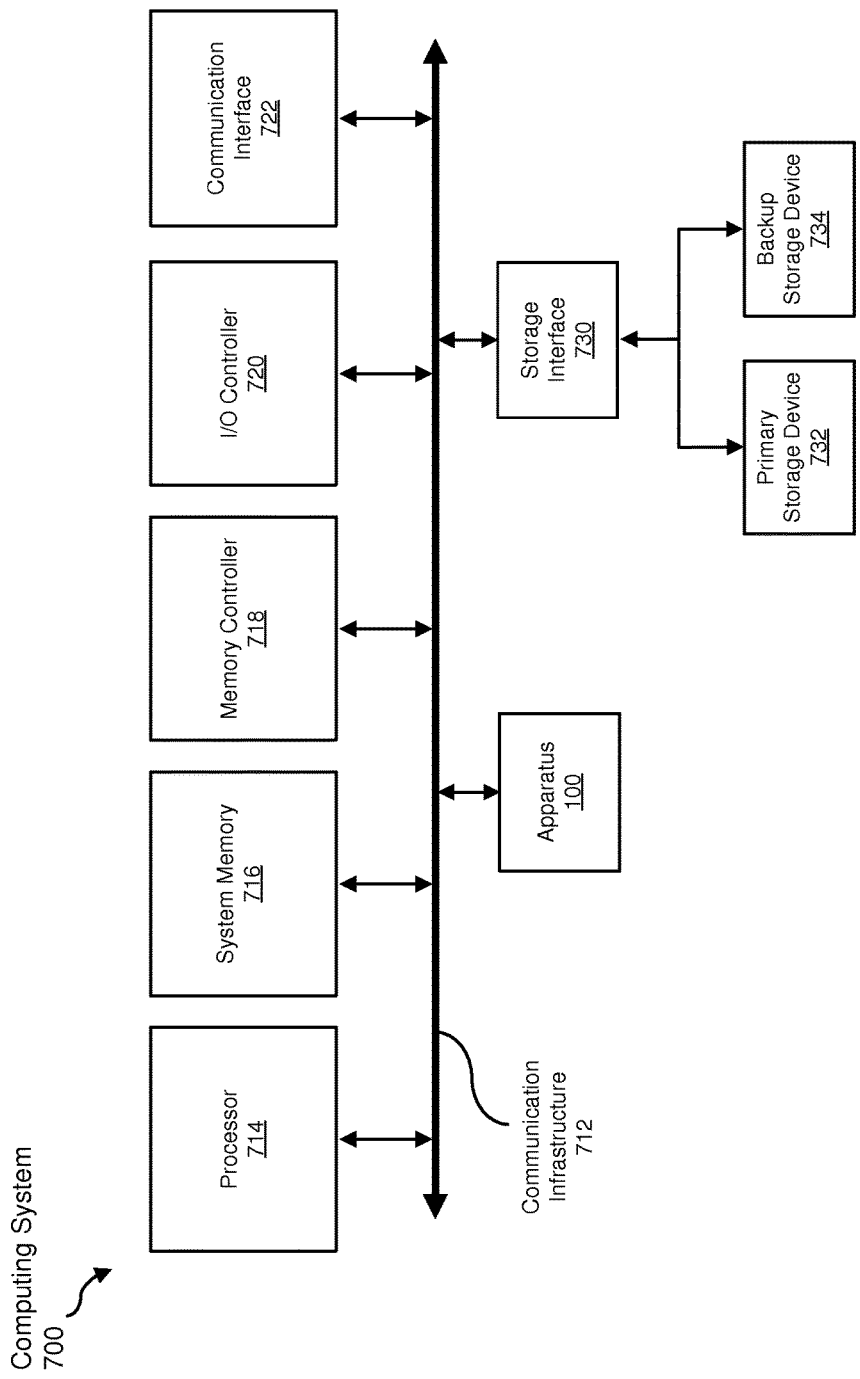
FIG. 7 is a block diagram of an exemplary computing system capable of implementing and/or being used in connection with one or more of the embodiments described and/or illustrated herein.

FIG. 7 is a block diagram of an exemplary computing system 700 capable of implementing and/or being used in connection with one or more of the embodiments described and/or illustrated herein. In some embodiments, all or a portion of computing system 700 may perform and/or be a means for performing, either alone or in combination with other elements, one or more of the steps described in connection with FIG. 6. All or a portion of computing system 700 may also perform and/or be a means for performing and/or implementing any other steps, methods, or processes described and/or illustrated herein. In one example, computing system 700 may include apparatus 100 from FIG. 1.

Computing system 700 broadly represents any type or form of electrical load, including a single or multi-processor computing device or system capable of executing computer-readable instructions. Examples of computing system 700 include, without limitation, workstations, laptops, client-side terminals, servers, distributed computing systems, mobile devices, network switches, network routers (e.g., backbone routers, edge routers, core routers, mobile service routers, broadband routers, etc.), network appliances (e.g., network security appliances, network control appliances, network timing appliances, SSL VPN (Secure Sockets Layer Virtual Private Network) appliances, etc.), network controllers, gateways (e.g., service gateways, mobile packet gateways, multi-access gateways, security gateways, etc.), and/or any other type or form of computing system or device.

Computing system 700 may be programmed, configured, and/or otherwise designed to comply with one or more networking protocols. According to certain embodiments, computing system 700 may be designed to work with protocols of one or more layers of the Open Systems Interconnection (OSI) reference model, such as a physical layer protocol, a link layer protocol, a network layer protocol, a transport layer protocol, a session layer protocol, a presentation layer protocol, and/or an application layer protocol. For example, computing system 700 may include a network device configured according to a Universal Serial Bus (USB) protocol, an Institute of Electrical and Electronics Engineers (IEEE) 1394 protocol, an Ethernet protocol, a T1 protocol, a Synchronous Optical Networking (SONET) protocol, a Synchronous Digital Hierarchy (SDH) protocol, an Integrated Services Digital Network (ISDN) protocol, an Asynchronous Transfer Mode (ATM) protocol, a Point-to-Point Protocol (PPP), a Point-to-Point Protocol over Ethernet (PPPoE), a Point-to-Point Protocol over ATM (PPPoA), a Bluetooth protocol, an IEEE 802.XX protocol, a frame relay protocol, a token ring protocol, a spanning tree protocol, and/or any other suitable protocol.

Computing system 700 may include various network and/or computing components. For example, computing system 700 may include at least one processor 714 and a system memory 716. Processor 714 generally represents any type or form of processing unit capable of processing data or interpreting and executing instructions. For example, processor 714 may represent an application-specific integrated circuit (ASIC), a system on a chip (e.g., a network processor), a hardware accelerator, a general purpose processor, and/or any other suitable processing element.

Processor 714 may process data according to one or more of the networking protocols discussed above. For example, processor 714 may execute or implement a portion of a protocol stack, may process packets, may perform memory operations (e.g., queuing packets for later processing), may execute end-user applications, and/or may perform any other processing tasks.

System memory 716 generally represents any type or form of volatile or non-volatile storage device or medium capable of storing data and/or other computer-readable instructions. Examples of system memory 716 include, without limitation, Random Access Memory (RAM), Read Only Memory (ROM), flash memory, or any other suitable memory device. Although not required, in certain embodiments computing system 700 may include both a volatile memory unit (such as, for example, system memory 716) and a non-volatile storage device (such as, for example, primary storage device 732, as described in detail below). System memory 716 may be implemented as shared memory and/or distributed memory in a network device. Furthermore, system memory 716 may store packets and/or other information used in networking operations.

In certain embodiments, exemplary computing system 700 may also include one or more components or elements in addition to processor 714 and system memory 716. For example, as illustrated in FIG. 7, computing system 700 may include a memory controller 718, an Input/Output (I/O) controller 720, and a communication interface 722, each of which may be interconnected via communication infrastructure 712. Communication infrastructure 712 generally represents any type or form of infrastructure capable of facilitating communication between one or more components of a computing device. Examples of communication infrastructure 712 include, without limitation, a communication bus (such as a Serial ATA (SATA), an Industry Standard Architecture (ISA), a Peripheral Component Interconnect (PCI), a PCI Express (PCIe), and/or any other suitable bus), and a network.

Memory controller 718 generally represents any type or form of device capable of handling memory or data or controlling communication between one or more components of computing system 700. For example, in certain embodiments memory controller 718 may control communication between processor 714, system memory 716, and I/O controller 720 via communication infrastructure 712. In some embodiments, memory controller 718 may include a Direct Memory Access (DMA) unit that may transfer data (e.g., packets) to or from a link adapter.

I/O controller 720 generally represents any type or form of device or module capable of coordinating and/or controlling the input and output functions of a computing device. For example, in certain embodiments I/O controller 720 may control or facilitate transfer of data between one or more elements of computing system 700, such as processor 714, system memory 716, communication interface 722, and storage interface 730.

Communication interface 722 broadly represents any type or form of communication device or adapter capable of facilitating communication between exemplary computing system 700 and one or more additional devices. For example, in certain embodiments communication interface 722 may facilitate communication between computing system 700 and a private or public network including additional computing systems. Examples of communication interface 722 include, without limitation, a link adapter, a wired network interface (such as a network interface card), a wireless network interface (such as a wireless network interface card), and any other suitable interface. In at least one embodiment, communication interface 722 may provide a direct connection to a remote server via a direct link to a network, such as the Internet. Communication interface 722 may also indirectly provide such a connection through, for example, a local area network (such as an Ethernet network), a personal area network, a wide area network, a private network (e.g., a virtual private network), a telephone or cable network, a cellular telephone connection, a satellite data connection, or any other suitable connection.

In certain embodiments, communication interface 722 may also represent a host adapter configured to facilitate communication between computing system 700 and one or more additional network or storage devices via an external bus or communications channel. Examples of host adapters include, without limitation, Small Computer System Interface (SCSI) host adapters, Universal Serial Bus (USB) host adapters, IEEE 1394 host adapters, Advanced Technology Attachment (ATA), Parallel ATA (PATA), Serial ATA (SATA), and External SATA (eSATA) host adapters, Fibre Channel interface adapters, Ethernet adapters, or the like. Communication interface 722 may also enable computing system 700 to engage in distributed or remote computing. For example, communication interface 722 may receive instructions from a remote device or send instructions to a remote device for execution.

As illustrated in FIG. 7, exemplary computing system 700 may also include a primary storage device 732 and/or a backup storage device 734 coupled to communication infrastructure 712 via a storage interface 730. Storage devices 732 and 734 generally represent any type or form of storage device or medium capable of storing data and/or other computer-readable instructions. For example, storage devices 732 and 734 may represent a magnetic disk drive (e.g., a so-called hard drive), a solid state drive, a floppy disk drive, a magnetic tape drive, an optical disk drive, a flash drive, or the like. Storage interface 730 generally represents any type or form of interface or device for transferring data between storage devices 732 and 734 and other components of computing system 700.

In certain embodiments, storage devices 732 and 734 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 732 and 734 may also include other similar structures or devices for allowing computer software, data, or other computer-readable instructions to be loaded into computing system 700. For example, storage devices 732 and 734 may be configured to read and write software, data, or other computer-readable information. Storage devices 732 and 734 may be a part of computing system 700 or may be separate devices accessed through other interface systems.

Many other devices or subsystems may be connected to computing system 700. Conversely, all of the components and devices illustrated in FIG. 7 need not be present to practice the embodiments described and/or illustrated herein. The devices and subsystems referenced above may also be interconnected in different ways from those shown in FIG. 7. Computing system 700 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable medium. The term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and other distribution systems.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of system 300 in FIG. 3 may represent portions of a cloud-computing or network-based environment. Cloud-computing and network-based environments may provide various services and applications via the Internet. These cloud-computing and network-based services (e.g., software as a service, platform as a service, infrastructure as a service, etc.) may be accessible through a web browser or other remote interface. Various functions described herein may also provide network switching capabilities, gateway access capabilities, network security functions, content caching and delivery services for a network, network control services, and/or and other networking functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A line card comprising:
an access surface that:
provides access to ports used to connect devices to a telecommunications network via the line card; and
includes a first section, a second section, and a slanted section that connects the first section and the second section;
a back opposite the access surface;
a first row of ports arranged along the first section of the access surface to house a set of transceivers;
a second row of ports arranged along the second section of the access surface to house an additional set of transceivers; and
wherein the second row of ports is recessed inward toward the back relative to the first row of ports due at least in part to the slanted section of the access surface.

2. The line card of claim 1, further comprising a faceplate corresponding to the access surface.

3. The line card of claim 2, wherein the faceplate comprises:
the first section, which fits the first row of ports; and
the second section, which fits the second row of ports.

4. The line card of claim 3, wherein the faceplate is formed as a single continuous member of the line card.

5. The line card of claim 3, wherein the faceplate further comprises the slanted section, between the first section and the second section, which slants toward the back opposite the access surface.

6. The line card of claim 5, wherein the slanted section is adjacent to the first section that fits the first row of ports.

7. The line card of claim 3, wherein the faceplate further comprises a slanted top section, adjacent a top end of the faceplate, that slants toward the back opposite the access surface.

8. The line card of claim 7, wherein the slanted top section comprises venting.

9. The line card of claim 3, wherein the faceplate further comprises a slanted bottom section, adjacent a bottom end of the faceplate, that slants toward the back opposite the access surface.

10. The line card of claim 9, wherein the slanted bottom section comprises venting.

11. The line card of claim 1, wherein:
the set of transceivers comprises latches for accessing the first row of ports; and
the latches are arranged to open in a direction substantially opposite from the first row of ports to the second row of ports.

12. A system comprising:
a telecommunications chassis comprising:
slots for housing modular line cards; and
connectors arranged to connect each of the module line cards to a telecommunications network;

the modular line cards connected to the telecommunications network through the connectors, at least one of the modular line cards comprising:

an access surface that:
provides access to ports used to connect devices to the telecommunications network via the line card; and includes a first section, a second section, and a slanted section that connects the first section and the second section;

a back opposite the access surface;

a first row of ports arranged along the first section of the access surface to house a set of transceivers;

a second row of ports arranged along the second section of the access surface to house an additional set of transceivers; and wherein the second row of ports is recessed inward toward the back relative to the first row of ports due at least in part to the slanted section of the access surface.

13. The system of claim 12, wherein the line card further comprises a faceplate corresponding to the access surface.

14. The system of claim 13, wherein the faceplate comprises:

the first section, which fits the first row of ports; and the second section, which fits the second row of ports.

15. The system of claim 14, wherein the faceplate is formed as a single continuous member of the line card.

16. The system of claim 14, wherein the faceplate further comprises the slanted section, between the first section and the second section, which slants toward the back opposite the access surface.

17. The system of claim 16, wherein the slanted section is adjacent to the first section that fits the first row of ports.

18. The system of claim 14, wherein the faceplate further comprises a slanted top section, adjacent a top end of the faceplate, that slants toward the back opposite the access surface.

19. The system of claim 18, wherein the slanted top section comprises venting.

20. A method comprising:

providing a line card comprising:

an access surface that:
provides access to ports used to connect devices to a telecommunications network via the line card; and includes a first section, a second section, and a slanted section that connects the first section and the second section;

a back opposite the access surface;

arranging a first row of ports along the first section of the access surface to house a set of transceivers;

arranging a second row of ports along the second section of the access surface to house an additional set of transceivers; and recessing the second row of ports inward toward the back relative to the first row of ports by way of the slanted section of the access surface.

* * * * *

UNITED STATES PATENT AND TRADEMARK OFFICE
CERTIFICATE OF CORRECTION

PATENT NO.        : 9,591,785 B1                                           Page 1 of 1
APPLICATION NO. : 14/228217
DATED             : March 7, 2017
INVENTOR(S)      : Nagarajan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 334 days.

Signed and Sealed this

Twenty-fifth Day of September, 2018

Andrei Iancu
*Director of the United States Patent and Trademark Office*